United States Patent
Ismail et al.

(10) Patent No.: US 7,378,911 B2
(45) Date of Patent: May 27, 2008

(54) WIDEBAND ULTRA LOW NOISE AMPLIFIER

(75) Inventors: Aly Ismail, Irvine, CA (US); Edward Youssoufian, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 129 days.

(21) Appl. No.: 11/377,824

(22) Filed: Mar. 16, 2006

(65) Prior Publication Data

US 2007/0216486 A1  Sep. 20, 2007

(51) Int. Cl.
*H03F 3/04* (2006.01)
(52) U.S. Cl. ..................... 330/311; 330/117
(58) Field of Classification Search ............. 770/311, 770/301, 117, 252, 254; 330/117, 252, 254, 330/301, 311
See application file for complete search history.

(56) References Cited

U.S. PATENT DOCUMENTS

| | | | |
|---|---|---|---|
| 4,956,615 A * | 9/1990 | Bohme et al. | 330/288 |
| 5,465,072 A * | 11/1995 | Atarodi | 330/254 |
| 6,366,171 B1 * | 4/2002 | Litmanen et al. | 330/301 |

OTHER PUBLICATIONS

Chehrazi, S. et al., "A 6.5 GHz Wideband CMOS Low Noise Amplifier for Multi-Band Use," Proceedings of the IEEE 2005 Custom Integrated Circuits Conference, 4 pages, San Jose, CA, Sep. 21, 2005.
Allstot, D. et al., "Design Considerations for CMOS Low-Noise Amplifiers," 2004 IEEE Radio Frequency Integrated Circuits Symposium, pp. 97-100, Fort Worth, TX, Jun. 6-8, 2004.

* cited by examiner

*Primary Examiner*—Henry K Choe
(74) *Attorney, Agent, or Firm*—Mohammad S. Rahman, Esq.; Gibb & Rahman, LLC

(57) ABSTRACT

A circuit and method of reducing noise in the circuit comprises a first transistor and an amplifier operatively connected to the first transistor, wherein the amplifier comprises a plurality of transistors and is adapted to amplify an input signal, and wherein the input signal is differentially captured at an output of the first transistor and the amplifier. Preferably, the plurality of transistors comprises a second transistor and a third transistor. Furthermore, a noise level of the first transistor and the third transistor are preferably cancelled. The size of the second transistor may be approximately 1/50Ω. Preferably, a gain on an amplifier stage formed by the second transistor and the third transistor is adapted to be increased. Moreover, an equivalent transconductance of the amplifier is preferably independent of an impedance matching on the amplifier. Preferably, a noise figure level of the circuit is less than approximately 1 dB.

20 Claims, 3 Drawing Sheets

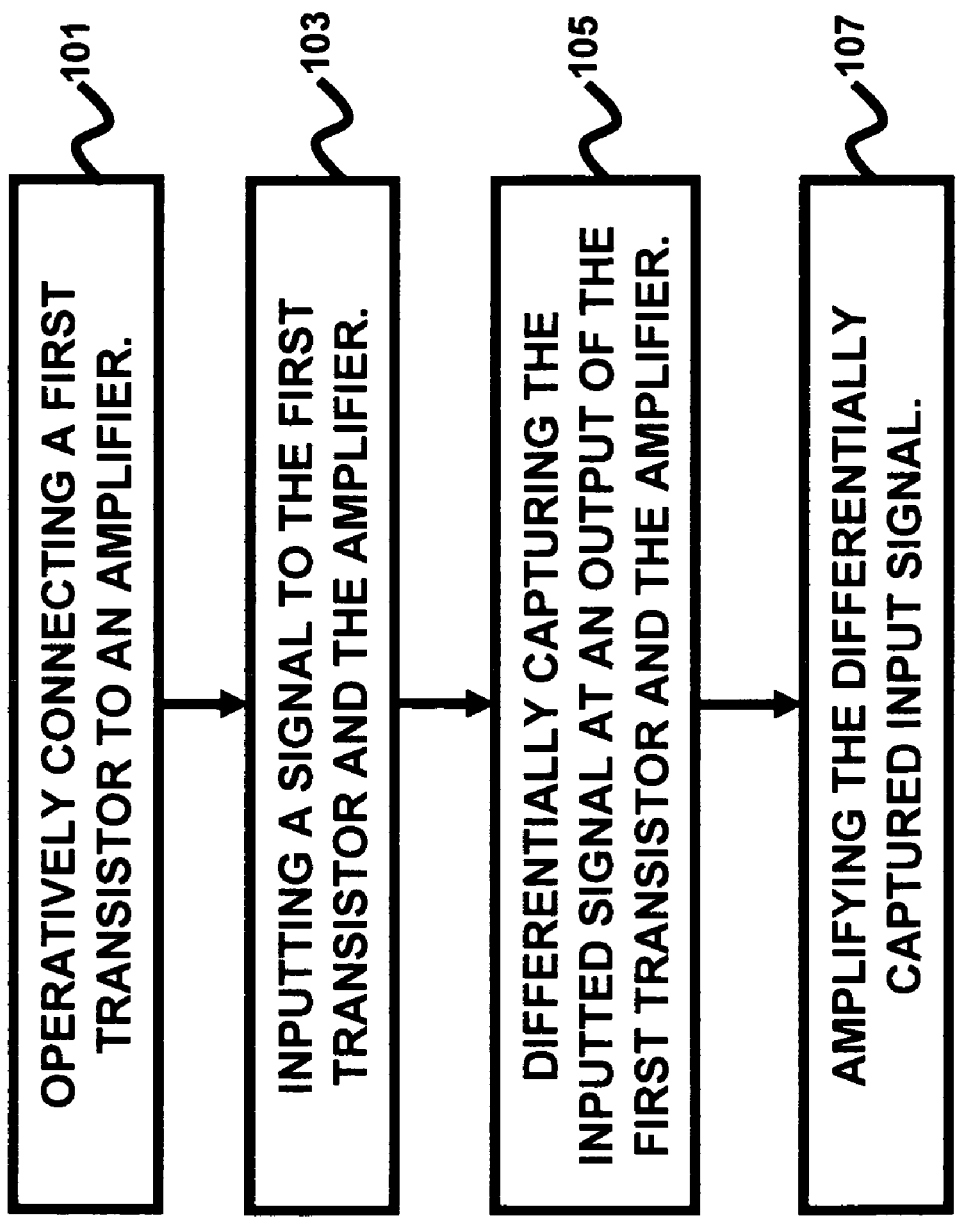

WIDEBAND ULTRA LOW NOISE AMPLIFIER

BACKGROUND

1. Technical Field

The embodiments herein generally relate to wideband radio frequency (RF) low noise amplifiers (LNAs), and, more particularly, to wideband LNAs used in advanced RF wireless communications.

2. Description of the Related Art

The noise figure (NF) of the first amplifier stage in a RF receiver presents a significant bottleneck in the cascaded performance and is usually the main challenge in the design of wireless systems. To obtain low levels of sensitivity which is very important for high quality wireless receivers, the NF of the LNA should be minimized, preferably lower than 2-3 dB. The problem is even more severe if the receiver is a wideband receiver; i.e., it operates over a wide range of frequencies.

Most of the conventional wideband solutions utilize resistive feedback amplifiers despite their poor NF, resulting in poor system sensitivity. To achieve a low power high dynamic range wideband LNA, a common-gate amplifier topology, such as the one shown in FIG. 1, may be used. The circuit generally has good properties (i.e., low power, good linearity) but tends to achieve poor a NF in advanced complementary metal oxide semiconductors (CMOS) devices and is usually greater than 4 dB. That is, the circuit shown in FIG. 1 results in a NF=1+$\gamma$ in deep submicron CMOS technology, which results in a NF greater than 4 dB.

To overcome the problem, a boosting technique for LNAs was proposed by Allstot, D. et al., "Design Considerations for CMOS Low-Noise Amplifiers," 2004 IEEE Radio Frequency Integrated Circuits Symposium, pages 97-100, Fort Worth, Tex., Jun. 6-8, 2004, the complete disclosure of which, in its entirety, is herein incorporated by reference. However, this circuit, shown in FIG. 2, requires an extra amplifier to function properly. The negative amplifier feedback circuit shown in FIG. 2 may theoretically result in a lower NF (NF=1+($\gamma$/(1−A))) than the NF of the circuit in FIG. 1. However, in practice, the NF will likely be heavily degraded by the inclusion of the extra amplifier in FIG. 2, which may tend to consume high power and generally still result in more than 2-3 dB of penalty on the NF. Therefore, in practice, the conventional circuit shown in FIG. 2 may not result in any significant improvement in the NF.

Another conventional solution is described by Chehrazi, S. et al., "A 6.5 GHz Wideband CMOS Low Noise Amplifier for Multi-Band Use," Proceedings of the IEEE 2005 Custom Integrated Circuits Conference, 4 pages, San Jose, Calif., Sep. 21, 2005, the complete disclosure of which, in its entirety, is herein incorporated by reference. This solution also employs CMOS technology to achieve low levels of NF. However, the NF levels remain approximately 3-4 dB.

Generally, the disadvantage of the conventional solutions is that, in some applications, the required NF from the LNA should be less than approximately 2 dB. In other words, the performance obtained from these conventional solutions is generally not enough for high-quality RF reception. Accordingly, there remains a need for a LNA circuit capable of achieving low levels of NF, preferably on the order of approximately 2 dB or less, which can be used in wideband applications.

SUMMARY

In view of the foregoing, an embodiment herein provides a circuit comprising a first transistor and an amplifier operatively connected to the first transistor, wherein the amplifier comprises a plurality of transistors and is adapted to amplify an input signal, and wherein the input signal is differentially captured at an output of the first transistor and the amplifier. Preferably, the plurality of transistors comprises a second transistor and a third transistor. Furthermore, a noise level of the first transistor and the third transistor are preferably cancelled. The size of the second transistor may be approximately $\frac{1}{50}\Omega$. Preferably, a gain on an amplifier stage formed by the second transistor and the third transistor is adapted to be increased. Moreover, an equivalent transconductance of the amplifier is preferably independent of an impedance matching on the amplifier. Preferably, a noise figure level of the circuit is less than approximately 1 dB.

Another embodiment provides a wideband low noise amplifying circuit comprising a primary transistor and a pair of secondary transistors adapted to amplify an input signal and operatively connected to the primary transistor, wherein the pair of secondary transistors comprises a second transistor and a third transistor, and wherein the input signal is differentially captured at an output of the primary transistor and the third transistor. Preferably, a noise level of the first transistor and the third transistor are cancelled. Additionally, the size of the second transistor may be approximately $\frac{1}{50}\Omega$. Preferably, a gain on an amplifier stage formed by the second transistor and the third transistor is adapted to be increased. Moreover, an equivalent transconductance of the second and third transistors is preferably independent of an impedance matching on the second and third transistors. Preferably, a noise figure level of the circuit is less than approximately 1 dB.

Another embodiment provides a method of reducing noise of an amplified signal in a circuit, wherein the method comprises operatively connecting a first transistor to an amplifier, wherein the amplifier comprises a plurality of transistors; inputting a signal to the first transistor and the amplifier; differentially capturing the inputted signal at an output of the first transistor and the amplifier; and amplifying the differentially captured input signal. The method may further comprise configuring the plurality of transistors to comprise a second transistor and a third transistor. Additionally, the method may further comprise canceling a noise level of the first transistor and the third transistor. Preferably, the method further comprises configuring a size of the second transistor to be approximately $\frac{1}{50}\Omega$. Also, the method may further comprise increasing a gain on an amplifier stage formed by the second transistor and the third transistor. Preferably, an equivalent transconductance of the amplifier is independent of an impedance matching on the amplifier. Furthermore, a noise figure level of the circuit is preferably less than approximately 1 dB.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 4 is a flow diagram illustrating a preferred method according to an embodiment herein.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 2:
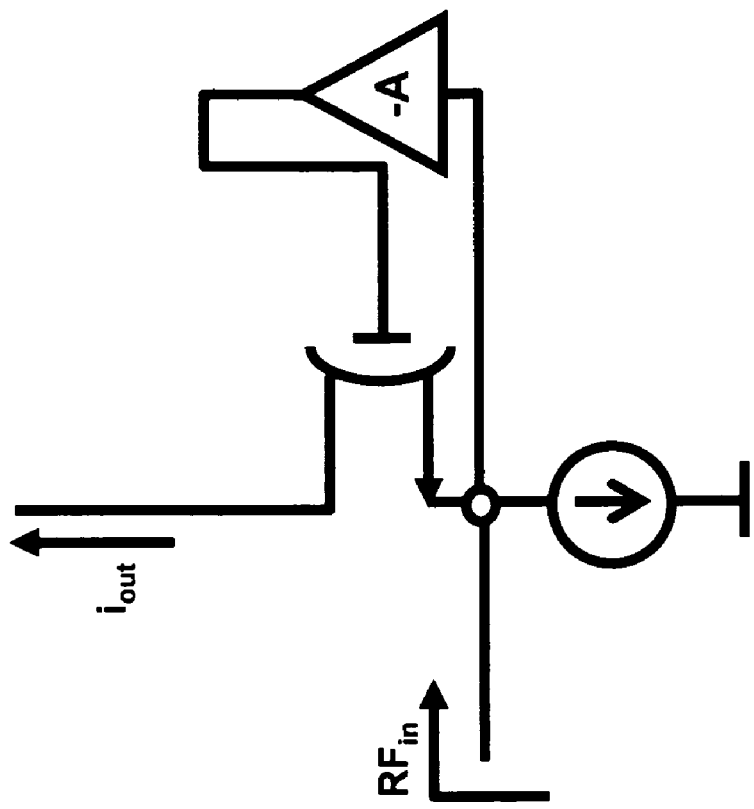
FIGS. 1 and 2 illustrate schematic diagrams of conventional LNA circuits.
Figure 1:
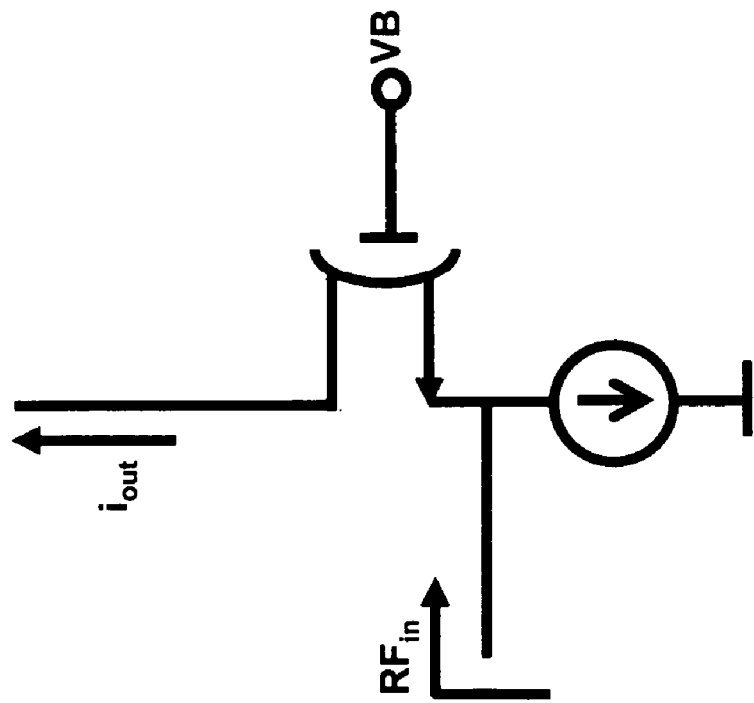
Figure 3:
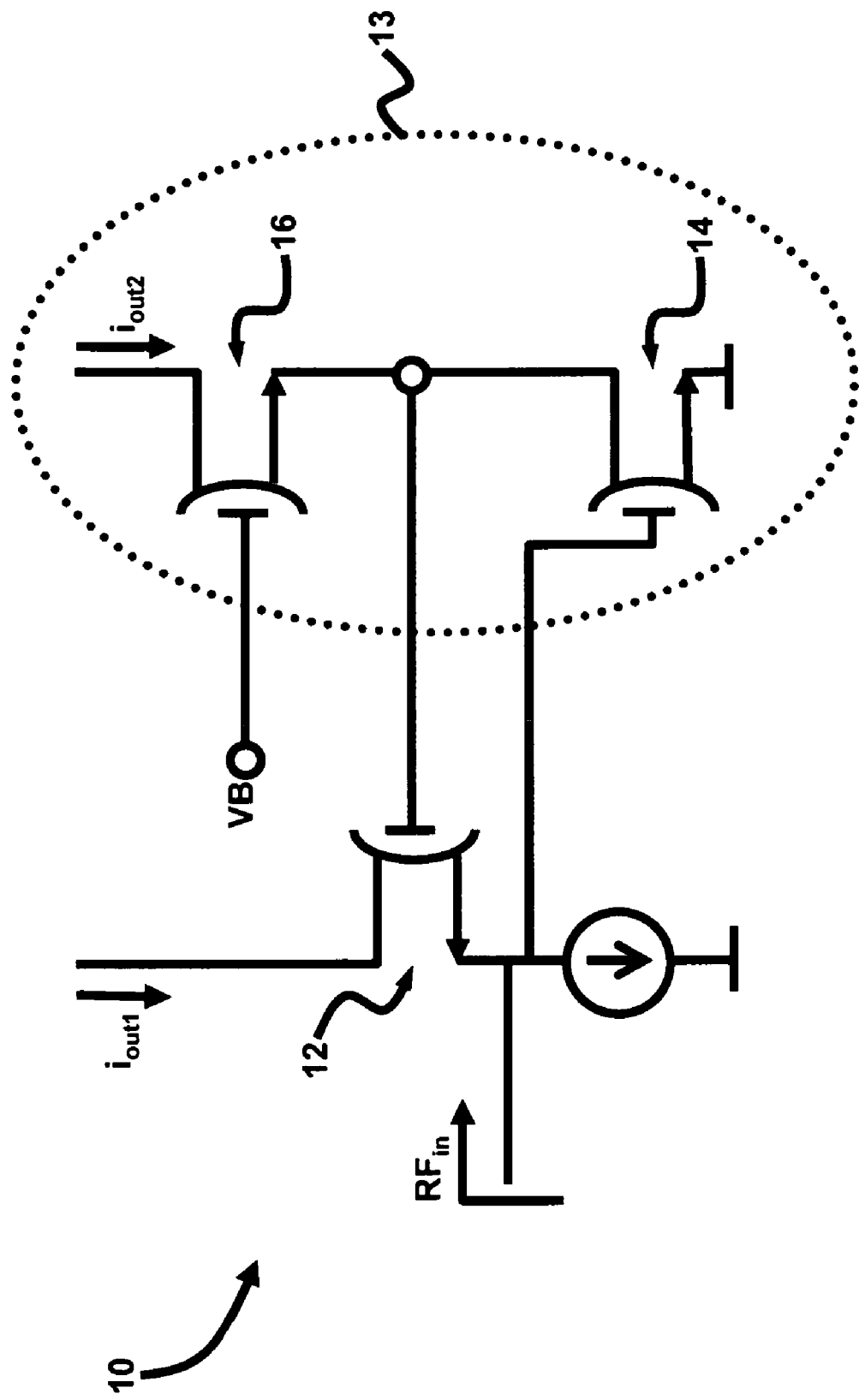
FIG. 3 illustrates a schematic diagram of LNA circuit according to an embodiment herein.

As mentioned, there remains a need for a LNA circuit capable of achieving low levels of NF, preferably on the order of approximately 2 dB or less, which can be used in wideband applications. The embodiments herein achieve this by providing a circuit that achieves very low NF levels for wireless receivers. The circuit achieves a NF less than approximately 1 dB over a wide range of frequencies. Referring now to the drawings, and more particularly to FIGS. 3 and 4, where similar reference characters denote corresponding features consistently throughout the figures, there are shown preferred embodiments.

FIG. 3 illustrates a LNA circuit 10 according to an embodiment herein. The circuit includes transistor 12 operatively connected to an amplifier 13, whereby the amplifier 13 comprises transistor 14 and transistor 16 and results in an input resistance of:

$$R_i = \frac{1}{g_{m12}\left[1 + \frac{g_{m14}}{g_{m16}}\right]}$$

where $g_{m12}$ is the transconductance of transistor 12, $g_{m14}$ is the transconductance of transistor 14, and $g_{m16}$ is the transconductance of transistor 16. The overall output current ($i_{outdiff}$) is sensed differentially by the following expression:

$$i_{outdiff} = i_{out1} - i_{out2}$$

where $i_{out1}$ is the output current to transistor 12 and $i_{out2}$ is the output current to transistor 16. By feeding the differential output current ($i_{outdiff}$) to the resistive load (not shown) of the LNA circuit 10 and detecting the resulting differential voltage via a differential mixer stage (not shown), the effective noise improvement is realized. Each of the transistors 12, 14, 16, in a field effect transistor (FET) configuration comprise a corresponding source, drain, gate, and channel region, which are not shown in FIG. 3 for clarity of the drawing. Additionally, each of the transistors 12, 14, 16 preferably comprise their own unique conductivity type. When the RF input signal ($RF_{in}$) is injected to the source terminal of transistor 12, it produces two current signals in transistor 12 and transistor 14, yet in opposite directions. The voltage feedback occurring via transistor 16 reduces significantly the noise contribution of transistor 12. This feedback action also reduces the noise of transistor 14 which is the only contributing device to the output noise. As the feedback gain (A) increases, the noise of transistor 14 is further reduced. The noise of transistor 16 can be simply treated as an added noise source to transistor 12 since it only modulates the gate voltage of the latter. As a result, the noise of transistor 14 is also significantly reduced. Generally, capturing the differential output current ($i_{outdiff}$) in the feedback action via transistor 16 results in significant reduction in the contribution of transistors 12 and 14. The remaining dominant noise source which is transistor 14 can be brought to very low levels by increasing the feedback gain (A). This allows one to achieve ultra low NF levels which are far superior from conventional approaches. Preferably, by sizing transistor 14 to $\frac{1}{50}\Omega$, the noise of transistor 12 and transistor 16 only appears common-mode and does not impact the overall differential output current ($i_{outdiff}$). The sizes of the transistors 12, 14, 16 can be arbitrarily modified to trade-off noise performance to linearity and current consumption. The input resistance should preferably be equal to 50 ohms to achieve proper impedance matching. The circuit 10 offers flexibility to size the transistors differently relative to each other and still achieving 50 ohms.

Furthermore, only transistor 14 contributes noise which can be lowered by increasing the ratio of the transconductance ($g_{m14}/g_{m16}$). This approach successfully lowers the NF in the LNA circuit 10 to approximately 1 dB. This value is achieved because the NF of the amplifier is given by: (NF=1($\gamma/(1+g_{m14}/g_{m16})$)). By increasing the ratio ($g_{m14}/g_{m16}$), the NF can be significantly reduced. Unlike the conventional LNAs, this improvement is realized without any noise penalty due to the presence of extra amplifiers. As a result, the circuit provided by the embodiments herein can practically realize NFs on the order of 1 dB. Those of ordinary skill in the art will understand methods that could be used to size ratio transistors 12, 14, 16 including appropriate doping concentrations in order to achieve desired parameters of transconductance.

The circuit 10 uses an amplifier 13 comprising transistor 14 and transistor 16, but is configured in such a way that the signal is captured at the output in differential mode rather than in a single ended mode. The resulting differential output current ($i_{outdiff}$) results in interesting properties. First, the noise of transistor 12 and transistor 16 are cancelled inside the circuit 10. Second, the noise of transistor 14 is significantly reduced. Additionally, greater noise suppression is achieved when the gain of the amplifier stage formed by transistor 14 and transistor 16 is increased by properly sizing transistors 14 and 16 as described above. Third, the circuit 10 is a single-ended to differential conversion, which is of great practical use and eliminates the need of an extra stage that would achieve this result.

In other words, in a conventional receiver, a single-ended to differential converter is needed in the RF front-end. This is typically implemented using a balun, which is device that converts between balanced and unbalanced electrical signals. Conversely, the circuit 10 offers the option of eliminating the need for such a building block as it converts the single-ended signal to a differential signal. Fourth, the feedback in the circuit 10 allows the use of a linear resistor (not shown) to degenerate transistor 12 leading to much higher linearity. This occurs by adding an extra resistor (not shown) at the source of transistor 12. Fifth, unlike the common-gate stage, the equivalent transconductance is independent of the impedance matching. The reason this is true is that the input resistance of the amplifier is given by:

$R_j=1/(g_{m12}(1+g_{m14}/g_{m16}))$ instead of $R_j=1/g_{m12}$ in the case of a simple gate topology. This means that the ratio $g_{m14}/g_{m16}$ can be adjusted to achieve proper matching in case $g_{m12}$ has to be changed due to the addition of the resistance. This flexability helps to achieve higher RF gain and hence a smaller NF with less number of stages and hence lowers power consumption.

FIG. 4, with reference to FIG. 3, illustrates a flow diagram of a method of reducing noise of an amplified signal, $RF_{in}$, in a circuit 10 according to an embodiment herein, wherein the method comprises operatively connecting (101) a first transistor 12 to an amplifier 13, wherein the amplifier 13 comprises a plurality of transistors 14, 16; inputting (103) a signal, $RF_{in}$, to the first transistor 12 and the amplifier 13; differentially capturing (105) the inputted signal, $RF_{in}$, at an output of the first transistor 12 and the amplifier 13; and amplifying (107) the differentially captured input signal, $RF_{in}$.

The method may further comprise configuring the plurality of transistors 14, 16 to comprise a second transistor 14 and a third transistor 16. Additionally, the method may further comprise canceling a noise level of the first transistor 12 and the third transistor 16. Preferably, the method further comprises configuring a size of the second transistor 14 to be approximately $1/50\Omega$. Also, the method may further comprise increasing a gain on an amplifier stage formed by the second transistor 14 and the third transistor 16. Preferably, an equivalent transconductance of the amplifier 13 is independent of an impedance matching on the amplifier 13. Furthermore, a noise figure (NF) level of the circuit 10 is preferably less than approximately 1 dB.

The embodiments may be used in the design/implementation of any receiver (for example, wireless, optical, wireline, etc.). Accordingly, because the embodiments provide a technique of achieving lower noise levels for any amplifier stage, it can be used in a variety of applications. Furthermore, a significant advantage achieved by the embodiments herein is that it provides an amplifier topology that achieves an approximately 1 dB noise level over a wideband of frequencies, which is approximately 2 dB less than conventional amplifiers. Moreover, because the circuit 10 uses local feedback to achieve the resulting low NF, those skilled in the art would readily acknowledge the circuit topology as unobvious over the conventional circuits.

The embodiments herein can also apply to amplifiers constructed in different technologies than CMOS such as bipolar complementary metal oxide semiconductor (BIC-MOS), silicon germanium (SiGe), bipolar, and gallium arsenide (GaAs) technologies. Furthermore, the embodiments herein can also be used for different applications other than wireless receivers in order to obtain low noise amplifiers.

The techniques provided by the embodiments herein facilitate fabrication of an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A circuit comprising:
a first transistor; and
an amplifier operatively connected to said first transistor, wherein said amplifier comprises a plurality of transistors including a second transistor and a third transistor and is adapted to amplify an input signal, wherein a node between the second and third transistors is directly connected to a gate of said first transistor;
wherein said input signal is differentially captured at an output of said first transistor and said amplifier.

2. The circuit of claim 1, all the limitations of which are incorporated herein by reference, wherein an input resistance of said amplifier is approximately 50Ω and equals $1/[g_{m1}(1+(g_{m2}/g_{m3}))]$, wherein a noise figure level of said circuit equals $1+[\gamma/(1+(g_{m2}/g_{m3}))]$, and wherein $g_{m1}$ is a transconductance of said primary transistor, $g_{m2}$ is a transconductance of said second transistor, $g_{m3}$ is a transconductance of said third transistor, and $\gamma$ is a bias-dependent parameter.

3. The circuit of claim 1, all the limitations of which are incorporated herein by reference, wherein a noise level of said first transistor and said third transistor are cancelled.

4. The circuit of claim 2, all the limitations of which are incorporated herein by reference, wherein a size of said second transistor is approximately 1/50Ω, and wherein the $g_{m2}/g_{m3}$ ratio can be adjusted to increase a gain on said amplifier and reduce said noise figure level of said circuit.

5. The circuit of claim 1, all the limitations of which are incorporated herein by reference, wherein a gain on an amplifier stage formed by said second transistor and said third transistor is adapted to be increased.

6. The circuit of claim 1, all the limitations of which are incorporated herein by reference, wherein an equivalent transconductance of said amplifier is independent of an impedance matching on said amplifier.

7. The circuit of claim 1, all the limitations of which are incorporated herein by reference, wherein a noise figure level of said circuit is less than approximately 1 dB, wherein an overall output current is sensed differentially and equals an output current to said first transistor minus an output current to said third transistor, and wherein said overall output current is fed back to a resistive load of said circuit.

8. A wideband low noise amplifying circuit comprising:
a primary transistor; and
a pair of secondary transistors adapted to amplify an input signal and operatively connected to said primary transistor, wherein said pair of secondary transistors comprises a second transistor and a third transistor, wherein a node between the second and third transistors is directly connected to a gate of said primary transistor, and wherein said input signal is differentially captured at an output of said primary transistor and said third transistor.

9. The circuit of claim 8, all the limitations of which are incorporated herein by reference, wherein a noise level of said primary transistor and said third transistor are cancelled.

10. The circuit of claim 8, all the limitations of which are incorporated herein by reference, wherein a size of said second transistor is approximately $1/50\Omega$.

11. The circuit of claim 8, all the limitations of which are incorporated herein by reference, wherein a gain on an amplifier stage formed by said second transistor and said third transistor is adapted to be increased.

12. The circuit of claim 8, all the limitations of which are incorporated herein by reference, wherein an equivalent transconductance of the second and third transistors is independent of an impedance matching on said second and third transistors.

13. The circuit of claim 8, all the limitations of which are incorporated herein by reference, wherein a noise figure level of said circuit is less than approximately 2 dB.

14. A method of reducing noise of an amplified signal in a circuit, said method comprising:
operatively connecting a first transistor to an amplifier, wherein said amplifier comprises a plurality of transistors comprising a second transistor and a third transistor, wherein a node between the second and third transistors is directly connected to a gate of said first transistor;
inputting a signal to said first transistor and said amplifier;
differentially capturing the inputted signal at an output of said first transistor and said amplifier; and
amplifying the differentially captured input signal.

15. The method of claim 14, all the limitations of which are incorporated herein by reference, wherein an input resistance of said amplifier is approximately $50\Omega$ and equals $1/[g_{m1}(1+(g_{m2}/g_{m3}))]$, wherein a noise figure level of said circuit equals $1+[\gamma/(1+(g_{m2}/g_{m3}))]$, and wherein $g_{m1}$ is a transconductance of said primary transistor, $g_{m2}$ is a transconductance of said second transistor, $g_{m3}$ is a transconductance of said third transistor, and $\gamma$ is a bias-dependent parameter.

16. The method of claim 14, all the limitations of which are incorporated herein by reference, further comprising canceling a noise level of said first transistor and said third transistor.

17. The method of claim 15, all the limitations of which are incorporated herein by reference, further comprising configuring a size of said second transistor to approximately $1/50\Omega$, and adjusting the $g_{m2}/g_{m3}$ ratio to increase a gain of said amplifier and reduce said noise figure level of said circuit.

18. The method of claim 14, all the limitations of which are incorporated herein by reference, further comprising increasing a gain on an amplifier stage formed by said second transistor and said third transistor.

19. The method of claim 14, all the limitations of which are incorporated herein by reference, wherein an equivalent transconductance of said amplifier is independent of an impedance matching on said amplifier.

20. The method of claim 14, all the limitations of which are incorporated herein by reference, wherein a noise figure level of said circuit is less than approximately 1 dB, wherein an overall output current is sensed differentially and equals an output current to said first transistor minus an output current to said third transistor, and wherein said overall output current is fed back to a resistive load of said circuit.

* * * * *